United States Patent
Vaidya et al.

(10) Patent No.: US 8,285,066 B2
(45) Date of Patent: Oct. 9, 2012

(54) SYSTEM AND METHOD FOR GENERATING HIGH RESOLUTION IMAGES

(75) Inventors: Vivek Prabhakar Vaidya, Bangalore (IN); Rakesh Mullick, Bangalore (IN); Shekhar Dwivedi, Lucknow (IN)

(73) Assignee: General Electric Company, Niskayuna, NY (US)

( * ) Notice: Subject to any disclaimer, the term of this patent is extended or adjusted under 35 U.S.C. 154(b) by 732 days.

(21) Appl. No.: 12/328,922

(22) Filed: Dec. 5, 2008

(65) Prior Publication Data

US 2010/0142841 A1   Jun. 10, 2010

(51) Int. Cl.
*G06K 9/40* (2006.01)
*G06K 9/00* (2006.01)
*G06K 9/36* (2006.01)

(52) U.S. Cl. .................. 382/254; 382/128; 382/276

(58) Field of Classification Search .................. None
See application file for complete search history.

(56) References Cited

U.S. PATENT DOCUMENTS

| | | | |
|---|---|---|---|
| 6,121,775 A * | 9/2000 | Pearlman | 324/309 |
| 6,341,179 B1 * | 1/2002 | Stoyle et al. | 382/254 |
| 7,101,336 B2 | 9/2006 | Miller et al. | |
| 7,508,548 B2 * | 3/2009 | Kuwata et al. | 358/3.01 |
| 7,623,724 B2 * | 11/2009 | Riccardi | 382/254 |
| 2002/0167533 A1 | 11/2002 | Tirumalai et al. | |
| 2005/0113695 A1 | 5/2005 | Miller | |
| 2005/0127910 A1 | 6/2005 | Visser et al. | |
| 2006/0030776 A1 | 2/2006 | Washburn et al. | |

FOREIGN PATENT DOCUMENTS

| | | |
|---|---|---|
| GB | 2262612 A | 6/1993 |
| WO | 0216963 A2 | 2/2002 |
| WO | 02067202 A1 | 8/2002 |
| WO | WO 2004/107767 A1 * | 12/2004 |

OTHER PUBLICATIONS

Robert Rohling, Andrew Gee and Laurence Berman; "Three-dimensional spatial compounding of ultrasound images"; Oxford University Press; Medical Image Analysis (1996/7) vol. 1, No. 3, pp. 177-193.

* cited by examiner

*Primary Examiner* — Vinh Nguyen
(74) *Attorney, Agent, or Firm* — Marie-Claire Maple

(57) ABSTRACT

A method is provided for generating a metavolume for reconstructing an image. The method provides for acquiring a plurality of low-resolution images of an imaged volume, the plurality of low-resolution images obtained from one or more imaging planes and merging the plurality of low-resolution images using a statistical operation to generate a metavolume. Systems and computer programs that afford functionality of the type defined by this method may be provided by the present technique.

12 Claims, 4 Drawing Sheets

SYSTEM AND METHOD FOR GENERATING HIGH RESOLUTION IMAGES

BACKGROUND

Embodiments of the invention relate generally to imaging techniques and more particularly to a technique for creating a high-resolution image volume employing low-resolution image volumes or localizers in magnetic resonance imaging.

Magnetic resonance imaging (MRI) is a noninvasive imaging technique that provides clinicians and diagnosticians with information about the anatomical structure and condition of a region of interest within an object. Commonly, the imaging technique involves formation of images of selected planes, or slices, of the object being imaged. Typically in MRI, a substantially uniform temporally constant main magnetic field is set up in an examination region where an object or a patient being examined is placed. The physical region of the slice is placed at the geometric center of a gradient field. Generally, an increasing field strength on one side of the field center, and a decreasing field strength on the other side will be exhibited by each gradient with the variations progressing in the direction of the particular gradient. The field strength at the field center will thus correspond to a nominal Larmor frequency for the MRI system, usually equal to that of the main magnetic field. The specific component of a gradient, which causes the desired slice to be excited, is called the slice selection gradient. The slice selection gradient is adjusted to acquire multiple slices.

Conventional MRI scans produce a data volume also referred to as localizers or scouts, wherein the localizers include voxels having three-dimensional characteristics. The voxel dimensions are determined by the physical characteristics of the MRI system as well as user settings. The image resolution of each voxel will be limited in at least one dimension, wherein the loss of resolution in such dimension(s) may lead to three-dimensional imaging problems.

In cardiac magnetic resonance (MR), imaging of the heart has been difficult because of the continuous movement of the heart as well as the movement of the lungs. Typically, cardiac MR involves acquisition of a series of localizer images or a set of low quality MRI volumes. These localizer images may be used for orientation to subsequently acquire a better-detailed view. Unfortunately, this procedure entails a laborious and time-consuming process. Moreover, the gradient fields in a typical MRI may not be perfectly calibrated resulting in misalignment of the localizers. Another drawback is that the object to be imaged may move during the time of imaging, which may disadvantageously result in misalignment of the localizer images and may induce artifacts in the images.

It is therefore desirable to produce a high quality MRI volume, which may facilitate further analysis and allow reuse of the acquisitions. Further, it is desirable to improve image quality and remove MR artifacts.

BRIEF DESCRIPTION

Briefly in accordance with one aspect of the technique a method is provided for reconstructing an image. The method provides for acquiring a plurality of low-resolution images of an imaged volume, the plurality of low-resolution images obtained from one or more imaging planes and merging the plurality of low-resolution images using a statistical operation to generate a metavolume. Systems and computer programs that afford functionality of the type defined by this method may be provided by the present technique.

In accordance with another aspect of the technique a method is provided for reconstructing an image. The method provides for acquiring a plurality of low-resolution images from one or more imaging planes, aligning the plurality of low-resolution images using a registration method and merging the plurality of low-resolution images by calculating a median to generate a metavolume. Here again, systems and computer programs that afford functionality of the type defined by this method may be provided by the present technique.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
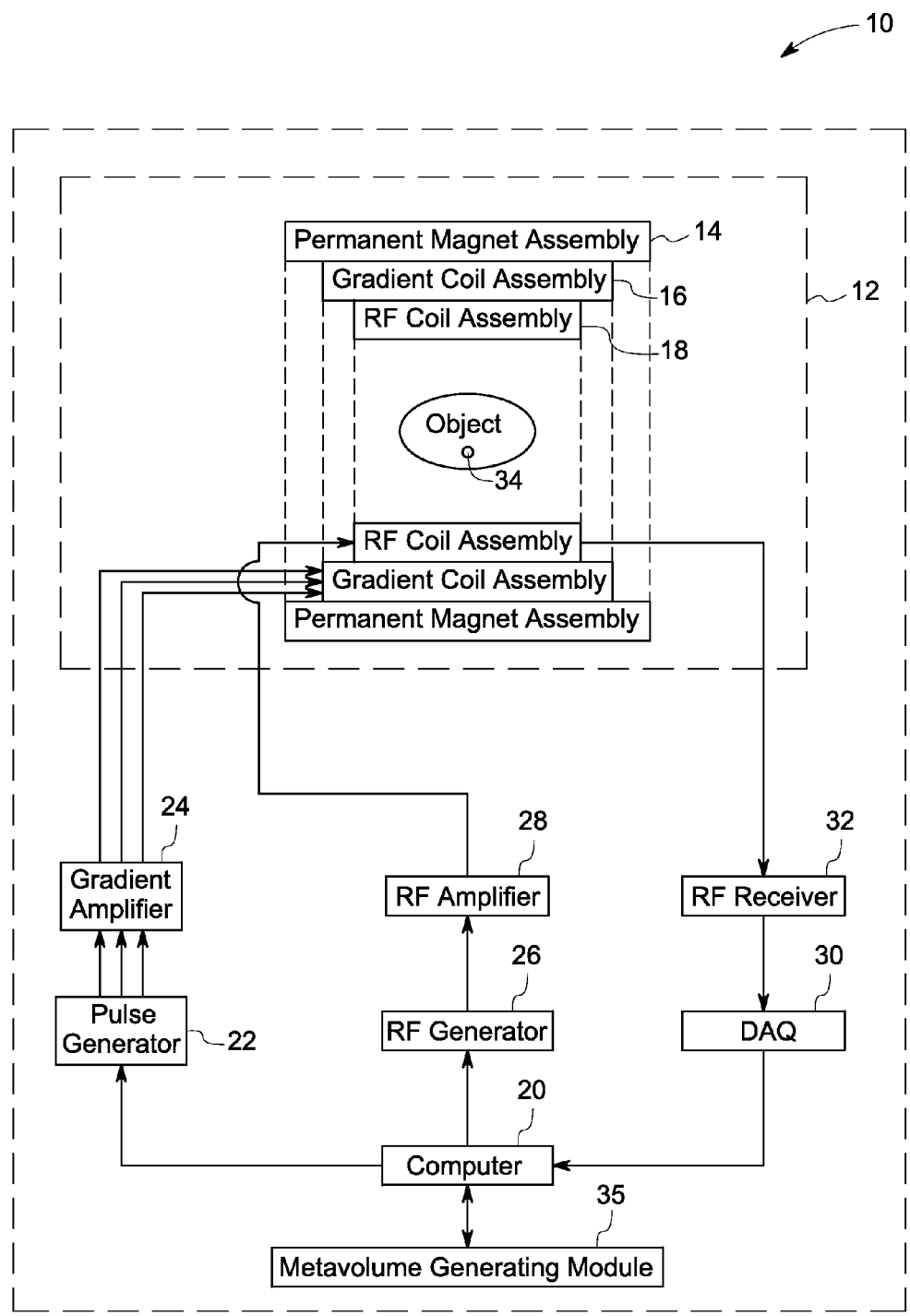
FIG. 1 is a schematic diagram of an MRI scanning device.

Embodiments of the present invention are generally directed to imaging techniques for generating a high quality image volume from low-resolution image volumes, where the high quality image volume may be used to improve image quality and reduce image artifacts. Referring now to FIG. 1, an imaging system 10 for generating digital images of an object, in accordance with an exemplary aspect of the present technique is illustrated. In the illustrated embodiment, the imaging system 10 is an MR imaging system is shown as including a scan unit 12, which is capable of scanning an object 34 and generating an image of an object 34 based on the magnetic resonance signals generated in the object 34 by emitting radio frequency (RF) pulses to the object 34 in a static magnetic field space. It may be noted that in one embodiment, the object 34 may include a patient. Although the present technique is described in terms of the object 34 including a patient, it may be noted that the present technique may also be applied to imaging other objects such as wood or small animals, or may be used in applications such as veterinary care or drug development etc.

It should be noted that although the exemplary embodiments illustrated hereinafter are described in the context of a MR imaging system, other imaging systems and applications such as industrial imaging systems and non-destructive evaluation and inspection systems, such as pipeline inspection systems, liquid reactor inspection systems, are also contemplated. Additionally, the exemplary embodiments illustrated and described hereinafter may find application in multi-modality imaging systems that employ an imaging system in conjunction with other imaging modalities, position-tracking systems or other sensor systems. Furthermore, it should be noted that the imaging system 10 may include imaging systems, such as, but not limited to, an X-ray imaging system, an ultrasound imaging system, a positron emission tomography (PET) imaging system, a computed tomography (CT) imaging system, or the like.

Further, in the embodiment illustrated in FIG. 1, the imaging system 10 is shown as including a permanent magnet assembly 14, a gradient coil assembly 16, an RF coil assembly 18, a computer 20, a pulse generator 22, a gradient amplifier 24, an RF generator 26, an RF amplifier 28, a data acquisition unit 30, and an RF receiver 32. The permanent magnetic assembly 14 may include a pair of permanent magnets, for example. The pair of permanent magnets may form a static magnetic field in the imaging area in which the object 34 is carried. While imaging system 10 may include any suitable MRI scanner or detector, in the illustrated embodiment the system includes a full body scanner comprising a bore (not shown in Fig) into which a table (not shown) may be positioned to place an object 34 in a desired position for scanning. The static field may be formed such that the direction of the static field extends along a direction perpendicular to a direction of the bore axis. Scan unit 12 may be of any suitable type of rating, and may include scanners varying from 0.5 Tesla ratings to 1.5 Tesla ratings and beyond.

Scan unit 12 includes a series of associated coils for producing controlled magnetic fields, for generating radiofrequency excitation pulses, and for detecting emissions from gyromagnetic material within the object 34 in response to such pulses. A gradient coil assembly 16 is used for generating controlled magnetic gradient fields during examination sequences. An RF coil assembly 18 is provided for generating radiofrequency pulses for exciting the gyromagnetic material. In one embodiment, the permanent magnetic assembly 14 may be made of superconducting magnets.

Moreover, the pulse generator 22 may be configured to generate gradient signals. These gradient signals may be amplified by the gradient amplifier 24 and transmitted to the gradient coil assembly 16, in response to a control signal received from the computer 20. Additionally, in response, the gradient coil assembly 16 may be configured to produce magnetic field gradients in the scanning region, where the magnetic field gradients may be employed to aid in spatially encoding acquired signals.

In addition, the RF generator 26 may be configured to generate signals that are amplified by the RF amplifier 28 and transmitted to the RF coil assembly 18, in response to a control signal received from the computer 20. In response, the RF coil assembly 18 may be configured to generate RF signals that propagate through the object 34 in the scanning region. These RF signals propagating through the object 34 may in turn be configured to induce nuclei in predetermined regions of an internal anatomy of the object 34 to emit RF signals that may be received by the RF receiver 32. The received RF signals may then be digitized by the data acquisition unit 30. In one embodiment, the data acquisition unit 30 may employ a phase detector device to detect a phase of the magnetic resonance signals received by the RF coil assembly 14. Additionally, the data acquisition unit 30 may use an analog-to-digital converter (ADC) to convert analog magnetic resonance signals, into digital magnetic resonance signals.

The digitized signals may then be communicated to the computer 20. Computer 20 may be configured to direct the various components in the imaging system 10 to perform corresponding predetermined operations in correspondence with the scanning procedure. In addition, the computer 20 may also be configured to perform predetermined data processing operations. More particularly, the computer 20 may be configured to reconstruct an image slice corresponding to a slice of the object 34 from the acquired image data. The image so generated may then be displayed on a display device (not shown in FIG. 1) based on control signals received from the computer 20.

In accordance with further aspects of the present technique, the imaging system 10 may include a metavolume-generating module 35. The metavolume generating module could be implemented in hardware or as software and it could be integrated as a part of the imaging system 10. In another embodiment, the metavolume generating module 35 may be located remotely from the imaging system 10 and may be communicatively coupled to the system 10 through a communications network. The metavolume-generating module 35 may be configured to generate a plurality of low-resolution images based on the scanning data. Further, the metavolume generating module 35 may also be configured to merge the plurality of low-resolution images to generate a metavolume as will be described later. In the present example, the metavolume generating module 35 is shown as being operationally coupled to the computer 20. Moreover, the computer 20 may also be configured to aid in visualizing the metavolume generated by the metavolume generating module 35 on the display.

Furthermore, the imaging system 10 may also include a storage unit (not shown in FIG. 1) that may be used to store data. In one embodiment, the storage unit may include memory configured to store the image data. It should be understood that any type of computer accessible memory device capable of storing the desired amount of data and/or code may be utilized by such an exemplary imaging system 10. Moreover, the storage unit may include one or more memory devices, such as magnetic, solid state, or optical devices, of similar or different types, which may be local and/or remote to the system 10. The storage unit may store data, processing parameters, and/or computer programs including one or more routines for performing the processes described herein.

With continuing reference to FIG. 1, in one exemplary embodiment, the computer 20 may be configured to generate two-dimensional (2D) digital images of the internal anatomy of the patient, or three-dimensional (3D) digital images of the internal anatomy of the patient, or both 2D digital images and 3D digital images using the data received from the data acquisition unit 30.

As will be appreciated, the number of voxels per unit volume determine the resolution of an image. The greater the number of voxels the higher is the image resolution. In the present embodiment, for an image volume of size 1 cm×1 cm×1 cm, a high-resolution image volume may have 100 or more voxels and a low-resolution image volume may have about 20-40 voxels. Alternately, if the high-resolution image volume has n voxels the low-resolution image volume has m voxels. In this case, the value of n is substantially higher than the value of m, that is n>>m. Furthermore, in accordance with aspects of the present technique, the imaging system 10 may be configured to acquire a plurality of low-resolution images or localizers. More particularly, the imaging system 10 may be configured to acquire a plurality of low-resolution images from a plurality of viewing planes. It may be noted that these viewing planes may include viewing planes, such as, but not limited to, an axial plane, a sagittal plane, or a coronal plane. As will be appreciated, these localizers are typically not employed for diagnostic purposes. However, the localizers may be employed to prescribe an area to be imaged in the object 34. More particularly, the localizers may be used to aid in the acquisition of a high-resolution image typically used for diagnostic purposes. In accordance with exemplary aspects of the present technique, localizers acquired from the plurality of viewing planes may be merged to create a high-resolution 3D image volume or a "metavolume", which may be utilized for image processing or visualization of the enhanced data that may be used for diagnostic purposes.

Moreover, it may be noted that the localizers that are acquired from the plurality of imaging planes may include non-isotropic localizers, thereby leading to image artifacts in the merged metavolume. It may be desirable to eliminate these image artifacts to enhance image quality. In accordance with aspects of the present technique, these non-isotropic localizers may be aligned with one another using image registration techniques. In one embodiment, 3D image registration techniques may be employed to align these non-isotropic localizers. In exemplary embodiment, an affine registration using a mutual information metric and a Regularized Gradient Step Descent (RGSD) optimizer may be used. In one embodiment, information obtained from the Digital Imaging and Communications in Medicine (DICOM) header may be employed to aid in aligning the low-resolution image volumes. The information obtained from the DICOM header may include dimensions of the low-resolution image volumes, their physical spacing from an origin located on the imaging system, and the like. Processing the non-isotropic localizers with the registration process advantageously aids in substantially reducing artifacts that may arise due to the scanning operation or due to motion of the object 34. These artifacts may include artifacts caused by respiratory or cardiac motion, flowing blood, or other patient motion, for example. Further, by registering the non-isotropic localizers, magnetic field inhomogeneities may be substantially reduced.

As noted hereinabove, the low-resolution localizers may be merged to generate a high-quality metavolume. In accordance with aspects of the present technique, an empty volume may be created. In one embodiment, the empty volume may be configured to have extents that are substantially equal to maximum extents of input volumes acquired from the plurality of imaging planes. The empty volume may then be filled by matching a physical point or a voxel in the plurality of low-resolution image volumes and combining them to produce a new intensity value. According to further aspects of the present technique, the low resolution image volumes may be merged using techniques such as, but not limited to, incorporating the three dimensional Euclidean distance between a volume element or voxel and the space in the empty volume. Alternatively, the low-resolution image volumes may be merged using order statistics. In one embodiment, a statistical operation such as, but not limited to, averaging the low resolution image volumes may be used. However, in another embodiment, a mean of the intensity value of the corresponding voxels in each of the low-resolution image volumes may be determined. Further, a voxel corresponding to an outlying intensity value may be discarded. Here an outlying voxel or an outlier in an image volume is a voxel whose intensity value is farthest from the mean intensity value of the selected voxels. For example, for a specific voxel, if three low-resolution image volumes are acquired, at a specific 3 dimensional point there will be three potential intensity values. If one of the intensity values disagrees with the other two it may be considered as an outlier and may be discarded. For example, if the voxels in the three low-resolution image volumes have intensity values as 100, 110 and 180 respectively, then the voxel in a low-resolution image volume that has intensity value as 180 is considered an outlier and is discarded. A new mean of intensity value corresponding to the remaining voxels of the low-resolution image volumes may then be computed. This process may be iteratively performed until the number of voxels in the low-resolution image volumes includes only two voxels.

As described hereinabove, the empty volume is filled by populating the empty volume with intensity values corresponding to the computed mean of intensity values of the voxels. In accordance with further aspects of the present technique, the plurality of low-resolution image volumes may also be merged to generate a metavolume by computing a median of the intensity values corresponding to the low-resolution image volumes.

Figure 2:
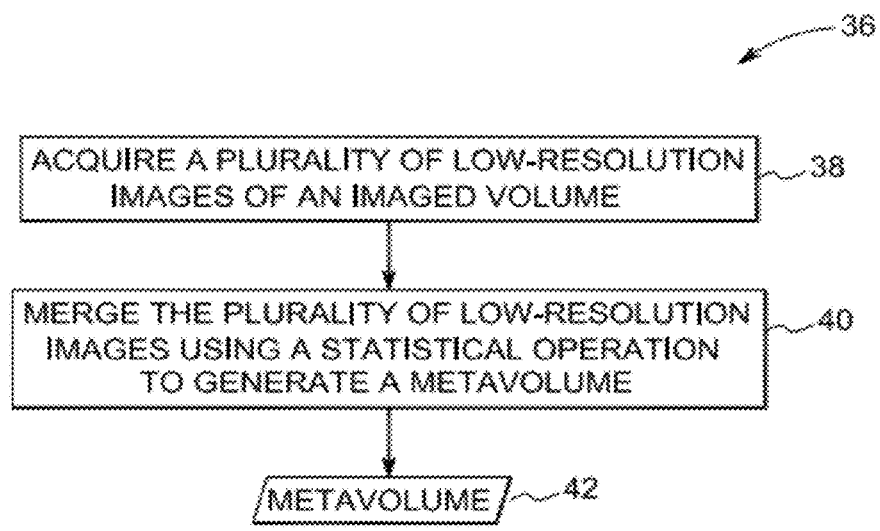
FIG. 2 is a flowchart depicting an exemplary method of reconstructing an image, according to aspects of the present technique.

Referring now to FIG. 2, a flow chart 36 illustrating an exemplary method for reconstructing an image is illustrated. More particularly, in accordance with aspects of the present technique, a method for generating a metavolume using a plurality of low-resolution image volumes is presented. The method starts at step 38, where a plurality of low-resolution images representative of an imaged volume may be acquired. Subsequently, these low-resolution images may be merged, as indicated by step 40. More particularly, in accordance with aspects of the present technique, at step 40, the plurality of low-resolution images may be merged via use of a statistical operation. Consequent to the merging of the low-resolution images at step 40, a metavolume 42 may be generated.

Figure 3:
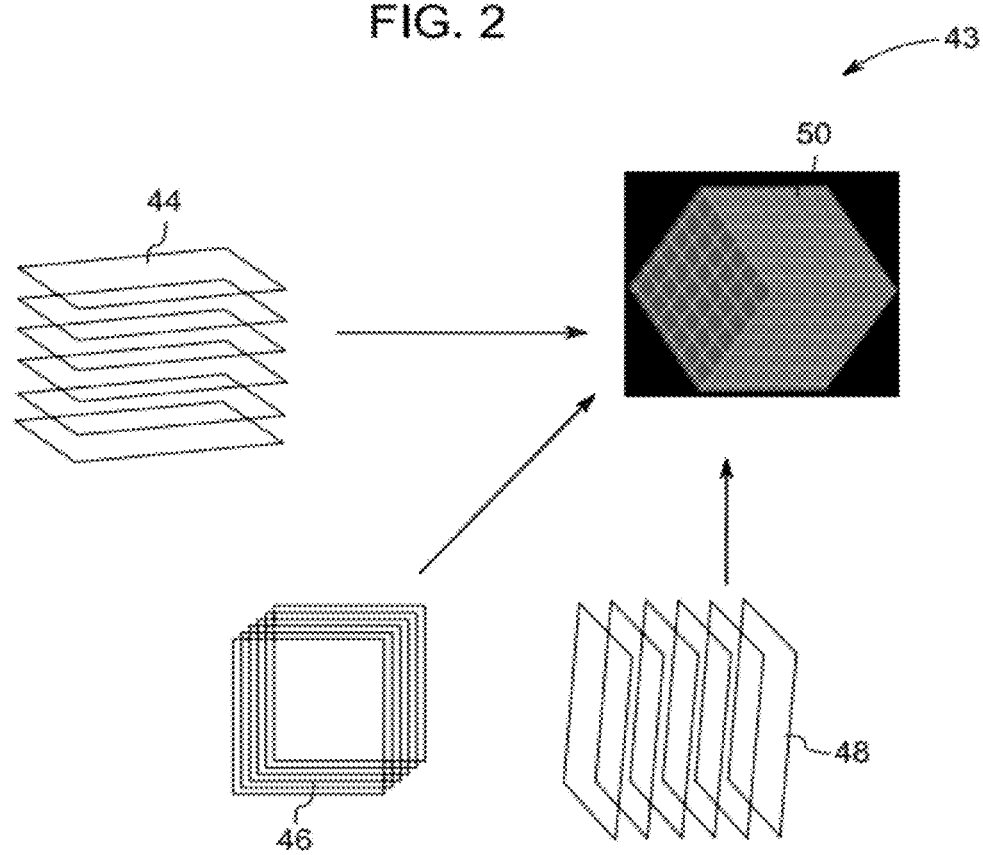
FIG. 3 is a diagrammatic illustration of the method of reconstructing an image of FIG. 2, according to aspects of the present technique.

As noted hereinabove with reference to FIG. 2, the plurality of low-resolution images may be merged via use of a statistical operation to generate a high-resolution metavolume 42. The process of FIG. 2 may be better understood with reference to FIG. 3. Turning now to FIG. 3, a diagrammatic illustration 43 of the method of reconstructing an image, and more particularly, the method of generating the metavolume 42 by merging a plurality of low-resolution images (see FIG. 2) is depicted.

As illustrated in FIG. 3, a plurality of low-resolution images representative of an anatomical region of interest in the object 34 (see FIG. 1), for example, may be acquired by the imaging system 10 (see FIG. 1). These low-resolution images may include localizers or scout images representative of the anatomical region of interest in the object 34. Such low-resolution images may be acquired from a plurality of viewing planes, as previously noted. By way of example, the low-resolution images may include an axial scout 44, a coronal scout 46, a sagittal scout 48, or a combination thereof. Subsequently, these scout images 44, 46, 48 may be merged via application of a statistical operation to create a metavolume 50. The metavolume 50 allows for multiple views to be created without the need for further acquisitions of images thereby reducing the workflow. In one embodiment, the metavolume 50 may be representative of the metavolume 42 of FIG. 2.

Figure 4:
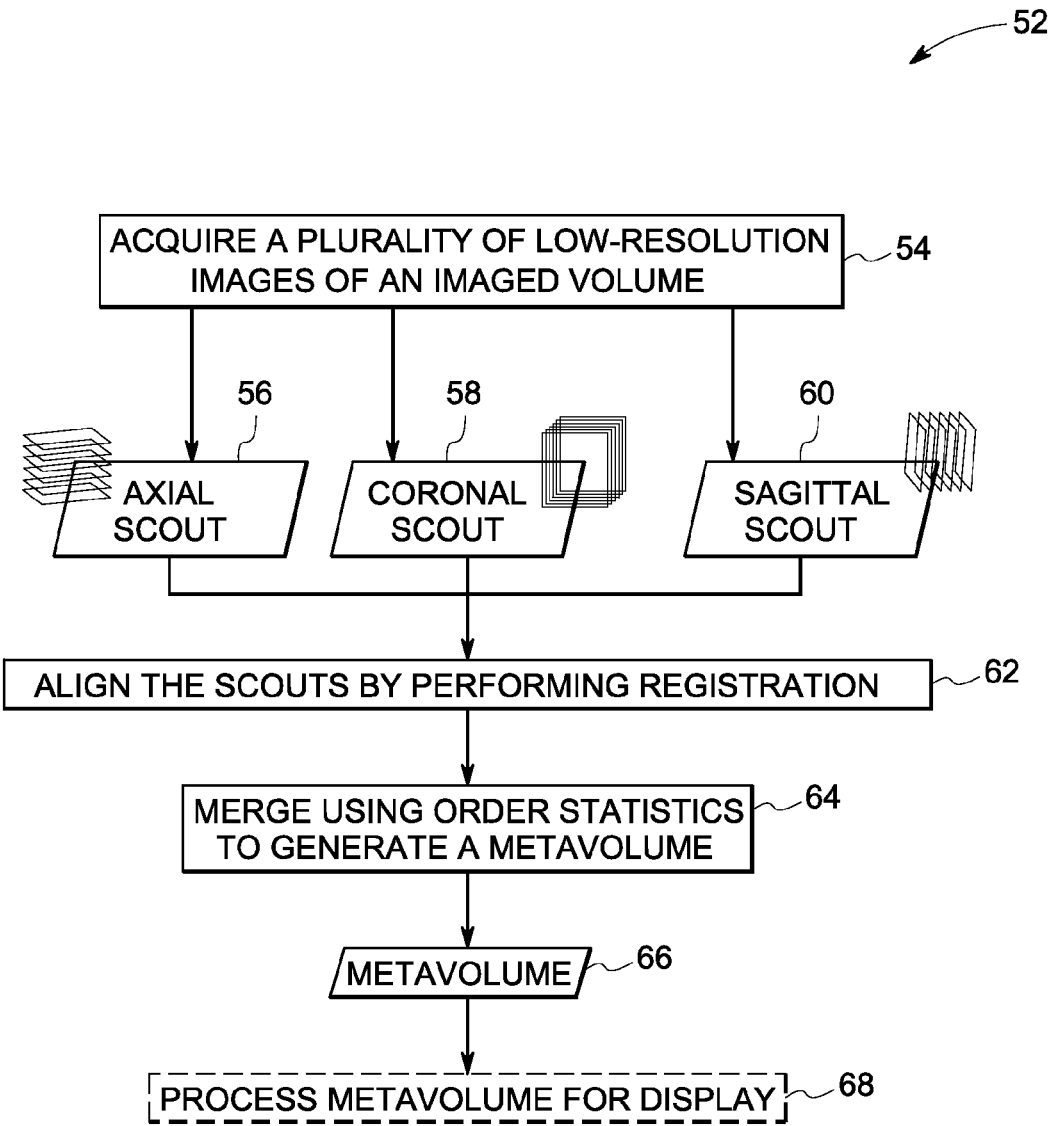
FIG. 4 is a flow chart depicting another exemplary method of reconstructing an image, according to another aspect of the present technique.

Moreover, as previously noted, in certain situations, the scout images or localizers may include non-isotropic images. FIG. 4 is a flow chart 52 illustrating another exemplary method for reconstructing an image, in accordance with aspects of the present technique. More particularly, an exemplary method for generating a metavolume by merging non-isotropic low-resolution images is presented. The method starts at step 54, where a plurality of low-resolution images may be acquired. As previously noted, these low-resolution images may be acquired from a plurality of viewing planes. Here again, the scout images or localizers may include an axial scout 56, a coronal scout 58, a sagittal scout 60, or combinations thereof. These scouts 56, 58, 60 may include non-isotropic images. Accordingly, these scouts 56, 58, 60 may be aligned by performing a registration, as indicated by step 62. Subsequently, at step 64, these registered scouts may be merged using order statistics to generate a metavolume 66.

Figure 5:
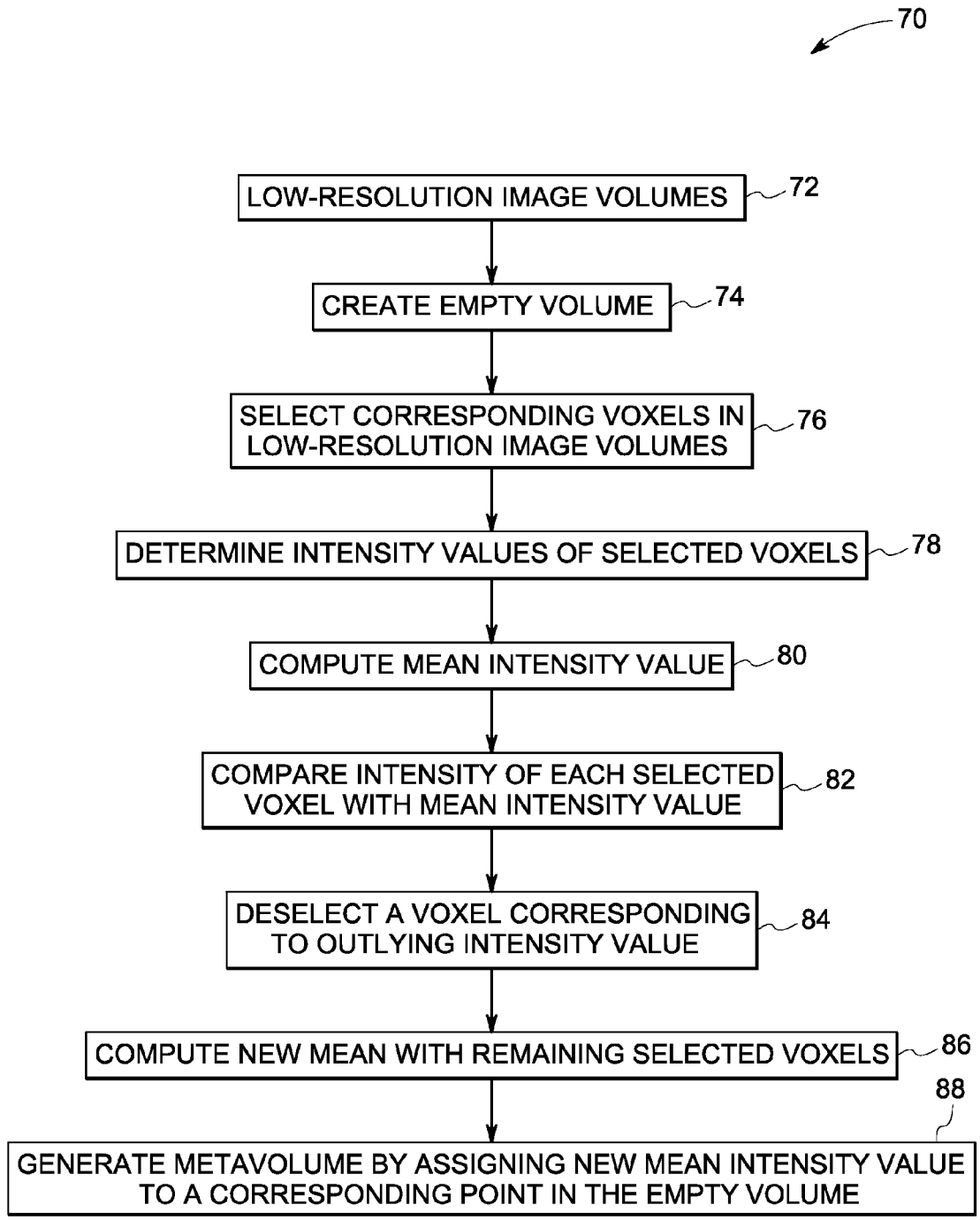
FIG. 5 is a flow chart depicting an exemplary method of merging low-resolution image volumes, according to one aspect of the present technique.

The method of merging these registered scouts using order statistics of step 64 may be better understood with reference to FIG. 5.

Referring now to FIG. 5, a flowchart 70 illustrating an exemplary method of merging one or more low-resolution image volumes 72 using order statistics is depicted. In one embodiment, these low-resolution image volumes may include the registered scouts of FIG. 4. Further, at step 74 an empty volume may be created. As previously noted, the empty volume may be configured to have extents that are substantially equal to maximum extents of input volumes acquired from the plurality of imaging planes.

Furthermore, in accordance with aspects of the present technique, the empty volume may be filled by populating the empty volume with a mean of intensity values of corresponding voxels in each of the low-resolution image volumes 72. Accordingly, at step 76, corresponding voxels in the low-resolution image volumes 72 may be selected. Subsequently, intensity values corresponding to each of these selected voxels may be determined, as indicated by step 78

Additionally, at step 80, a mean of intensity values corresponding to the selected voxels may be computed. Subsequently, the intensity values of each of the selected voxels may be compared with the computed mean of intensity values, as depicted by step 82. Moreover, a voxel with an "outlying" intensity value may be deselected, at step 84. In other words, an "outlying" voxel or an "outlier" may be representative of a voxel whose intensity value is farthest from the computed mean intensity value corresponding to the selected voxels. By way of example, if the selected voxels in the three low-resolution image volumes have intensity values as 110, 115 and 175 respectively, then the voxel in a low-resolution image volume that has intensity value as 175 is considered an outlier and is discarded.

Subsequently, at step 86, a new mean of intensity values corresponding to the remaining selected voxels may be computed. The empty volume may be populated by filling a corresponding point in the empty volume with the new mean intensity value. In certain other embodiments, this process may be iteratively performed until the number of voxels in the low-resolution image volumes includes only two voxels.

As described hereinabove, the empty volume is filled by populating the empty volume with intensity values corresponding to the computed mean of intensity values of the voxels. In accordance with further aspects of the present technique, the plurality of low-resolution image volumes may also be merged to generate a metavolume by computing a median of the intensity values corresponding to the low-resolution image volumes.

With returning reference to FIG. 4, the metavolume 66 may then be processed for display at step 70 on a display device, for example. Moreover, the metavolume 66 may also be processed to aid a clinician in diagnosis, analysis, and quantification of possible disease states. In addition, the metavolume 66 may be processed to facilitate enhanced acquisition of image data. By implementing the method of reconstructing the image as described hereinabove, any image artifacts due to the non-isotropic nature of the scout images 56, 58, 60 may advantageously be eliminated, thereby enhancing the quality of the image presented to a clinician for diagnosis, analysis and quantification, for example.

As will be appreciated by those of ordinary skill in the art, the foregoing example, demonstrations, and process steps may be implemented by suitable code on a processor-based system, such as a general-purpose or special-purpose computer. It should also be noted that different implementations of the present technique may perform some or all of the steps described herein in different orders or substantially concurrently, that is, in parallel. Furthermore, the functions may be implemented in a variety of programming languages, including but not limited to C++ or Java. Such code, as will be appreciated by those of ordinary skill in the art, may be stored or adapted for storage on one or more tangible, machine readable media, such as on memory chips, local or remote hard disks, optical disks (that is, CDs or DVDs), or other media, which may be accessed by a processor-based system to execute the stored code. Note that the tangible media may comprise paper or another suitable medium upon which the instructions are printed. For instance, the instructions can be electronically captured via optical scanning of the paper or other medium, then compiled, interpreted or otherwise processed in a suitable manner if necessary, and then stored in a computer memory.

The methods and systems for generating a metavolume described hereinabove advantageously aid in the removal of artifacts and facilitate enhanced image quality. Further, the techniques described hereinabove accelerate image processing applications by requiring fewer scans and improve the MR workflow without the need for hardware changes in the system. The techniques may also be used to accelerate or refine field calibration.

The above-description of the embodiments of the method for reconstructing an image and the system for reconstructing an image have the technical effect of improving workflow by enhancing image quality and reducing image artifacts, thereby allowing acceleration of image processing applications.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for reconstructing an image, the method comprising:
    acquiring a plurality of low-resolution images of an imaged volume, wherein the plurality of low resolution images is obtained from one or more imaging planes; and
    merging the plurality of low-resolution images using order statistics selected from a group comprising calculating a mean intensity value, and a median intensity value of corresponding voxels selected from each of the plurality of low resolution images to generate a high resolution 3D image volume.

2. The method claim 1, further comprising:
    comparing the mean intensity value with intensity values associated with the selected corresponding voxels to identify a voxel with an outlying intensity value; and
    deselecting the voxel corresponding to the outlying intensity value.

3. The method of claim 2, further comprising computing a new mean intensity value by selecting corresponding voxels from remaining voxels.

4. The method of claim 3, further comprising assigning the new mean intensity value to a corresponding point in an empty volume to generate the high resolution 3D image volume.

5. The method of claim 4, further comprising iteratively determining another mean of intensity values associated with remaining selected voxels by deselecting an outlying voxel until the selected voxels comprises two voxels.

6. The method of claim 1, further comprising aligning the plurality of low-resolution images before merging the plurality of low-resolution images.

7. The method of claim 1, wherein the high resolution 3D image volume comprises a non-isotropic volume.

8. A method for reconstructing an image, the method comprising:
   acquiring a plurality of low-resolution images from one or more imaging planes;
   aligning the plurality of low-resolution images using a registration method; and
   merging the plurality of low-resolution images by calculating a median of intensity values of corresponding voxels from each of the plurality of low-resolution images to generate a high resolution 3D image volume.

9. A system for generating a high resolution 3D image volume for reconstructing an image, the system comprising:
   a scanning device configured to scan an internal anatomy of a object to obtain scanning data;
   a 3D image volume generating module coupled to the scanning device, wherein the 3D image volume generating module is configured to:
   generate a plurality of low-resolution images based on the scanning data; and
   merge the plurality of low-resolution images using order statistics selected from a group comprising calculating a mean intensity value, and a median intensity value of corresponding voxels selected from each of the plurality of low resolution images to generate a high resolution 3D image volume.

10. The system of claim 9, further configured to
    compare the mean intensity value with intensity values associated with the selected voxels to identify a voxel with an outlying intensity value; and
    deselect the voxel corresponding to the outlying intensity value.

11. The system of claim 9, wherein the 3D image volume generating module is further configured to align the low-resolution images before merging the plurality of low-resolution images.

12. The system of claim 9, wherein the 3D image volume generating module is further configured to remove magnetic field inhomogeneity.

* * * * *